(12) United States Patent
Van de Rijdt et al.

(10) Patent No.: US 9,052,613 B2
(45) Date of Patent: Jun. 9, 2015

(54) DISPLACEMENT DEVICE, LITHOGRAPHIC APPARATUS AND POSITIONING METHOD

(75) Inventors: Johannes Hubertus Antonius Van de Rijdt, Gemert (NL); Joost Jeroen Ottens, Veldhoven (NL); Marcus Martinus Petrus Adrianus Vermeulen, Leende (NL); Erik Johannes Antonius Manders, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1064 days.

(21) Appl. No.: 13/105,748

(22) Filed: May 11, 2011

(65) Prior Publication Data

US 2011/0299054 A1 Dec. 8, 2011

Related U.S. Application Data

(60) Provisional application No. 61/352,214, filed on Jun. 7, 2010.

(51) Int. Cl.
*G03B 27/58* (2006.01)
*G03F 7/20* (2006.01)
*H02K 41/03* (2006.01)

(52) U.S. Cl.
CPC ............ *G03F 7/70758* (2013.01); *H02K 41/03* (2013.01)

(58) Field of Classification Search
CPC . G03F 7/70758; H02K 41/03; H02K 2201/18
USPC ............................ 355/72, 75, 67, 53; 310/12
See application file for complete search history.

(56) References Cited

U.S. PATENT DOCUMENTS

| 6,437,463 | B1 * | 8/2002 | Hazelton et al. ........... 310/12.06 |
| 6,822,730 | B2 | 11/2004 | Krikhaar et al. |
| 7,483,120 | B2 | 1/2009 | Luttikhuis et al. |
| 2002/0000904 | A1 | 1/2002 | Compter et al. |
| 2004/0052031 | A1 | 3/2004 | Krikhaar et al. |
| 2007/0263197 | A1 | 11/2007 | Luttikhuis et al. |
| 2007/0267920 | A1 * | 11/2007 | Korenaga ........................ 310/12 |
| 2009/0310145 | A1 | 12/2009 | Sugiyama et al. |

FOREIGN PATENT DOCUMENTS

| CN | 1487365 | 4/2004 |
| CN | 101071276 | 11/2007 |
| JP | 2001-217172 | 8/2001 |
| JP | 2006-222206 | 8/2006 |
| JP | 2008-004647 | 1/2008 |
| WO | 2009/128321 | 10/2009 |

OTHER PUBLICATIONS

Japanese Office Action mailed Aug. 24, 2012 in corresponding Japanese Patent Application No. 2011-121865.

* cited by examiner

*Primary Examiner* — Peter B Kim
(74) *Attorney, Agent, or Firm* — Pillsbury Winthrop Shaw Pittman LLP (57) ABSTRACT

A displacement device with a first and second part which are displaceable relative to one another, the first part being provided with a system of magnets, the second part being provided with a set of coil block units including: at least three first coil block units having current conductors oriented parallel to a second direction, at least two second coil block units having current conductors oriented parallel to a first direction, wherein the displacement device includes a controller configured to control the position of the second part relative to the first part, and wherein when the second part mainly moves in the second direction the controller is configured to levitate the second part from the first part in the third direction by using first coil block units only.

20 Claims, 5 Drawing Sheets

DISPLACEMENT DEVICE, LITHOGRAPHIC APPARATUS AND POSITIONING METHOD

CROSS REFERENCE TO RELATED APPLICATIONS

This application claims priority and benefit under 35 U.S.C. §119(e) to U.S. Provisional Patent Application No. 61/352,214, entitled "Displacement Device, Lithographic Apparatus and Stage System Positioning Method", filed on Jun. 7, 2010. The content of that application is incorporated herein in its entirety by reference.

FIELD

The present invention relates to a displacement device, in combination a stage system and a reference structure, and a lithographic apparatus including such a displacement device or combination. The invention further relates to a method for positioning a second part of a displacement device relative to a first part of a displacement device according to the invention.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Commonly, the substrate and/or patterning device (e.g. the reticle) are supported and positioned by a respective moveable stage system including a displacement device to move the stage system relative to a frame, e.g. a base frame or another kind of reference structure. Such displacement devices include a first part on the frame and a second part on the stage system which are displaceable relative to one another in a first direction and a second direction perpendicular to the first direction.

The first part includes a carrier which extends substantially parallel to the first and second direction. On the carrier a system of magnets is fastened in accordance with a pattern whereby magnets of a first kind with a magnetization direction perpendicular to the carrier and directed towards the second part and magnets of a second kind with a magnetization direction perpendicular to the carrier and directed away from the second part are arranged in accordance with a pattern of rows and columns perpendicular thereto and enclosing an angle of approximately 45° with one of the first or second direction, such that the magnets of the first kind and the magnets of the second kind are arranged in each row and in each column alternately. In this application, magnets of the first kind and magnets of the second kind may alternatively be referred to as first and second magnets respectively.

Figure 2A:
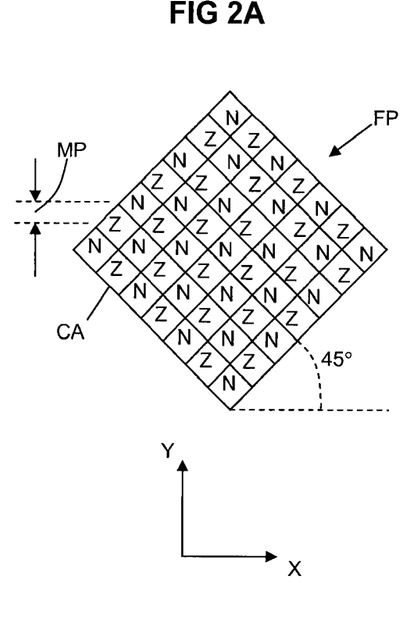
FIG. 2A depicts schematically a first part of a displacement device according to an embodiment of the invention.

An example of such a carrier is shown in FIG. 2A, wherein the magnets of the first kind are denoted N, the magnets of the second kind are denoted Z, the first direction is denoted X, and the second direction is denoted Y. Hence, the magnetization directions of both the magnets of the first and second kind (N,Z) are parallel to a third direction, wherein the third direction is perpendicular to both the first and second direction.

The second part is provided with an electric coil system having a set of coil block units, each coil block unit having current conductors which are situated in a magnetic field of the system of magnets and are being fed by a multi-phase system.

Figure 2B:
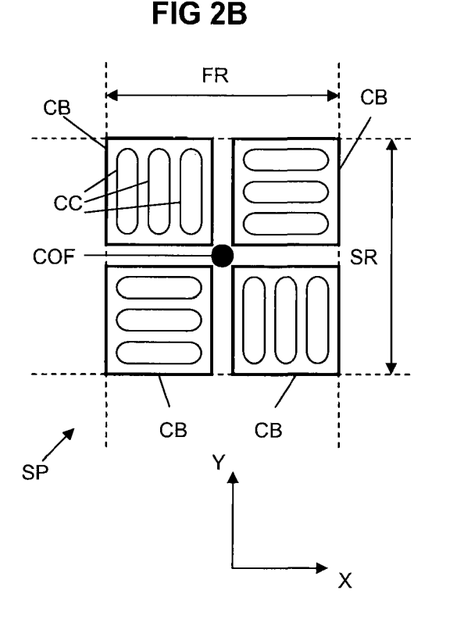
FIG. 2B depicts schematically a second part of a prior art displacement device.

Known displacement devices normally have a set of four coil block units as shown in FIG. 2B, wherein two coil block units are of a first kind in which current conductors are oriented in the second direction to apply a force between the first and second part in the first direction based on Lorentz law. The other two coil block units are of a second kind in which current conductors are oriented in the first direction to apply a force between the first and second part in the second direction based on Lorentz law. Usually the coil block units are also able to provide a force between the first and second part in the third direction, e.g. to levitate the second part relative to the first part. In FIG. 2B, a coil block unit is denoted CB, the current conductors are denoted CC, and the first and second direction are denoted X and Y respectively.

Currents through the current conductors of a coil block will generate forces depending amongst others on the orientation of the local magnetic field. However, the currents can be driven such that the sum of the forces is applied in the respective first or second direction. If also the current conductors are used to levitate the second part, a levitation force can be applied independently from the force in the first or second direction, thereby allowing full control of the movement of the stage system in all applicable directions.

Each coil block unit is thus a force generating element having a maximum force that it can generate, the maximum force being determined amongst others by the magnetic field strength, amount and location of current conductors, and a maximum allowable current.

When the coil block units are driven to generate their maximum forces in respectively the first, second direction, and possibly third direction, there will be a line or point in which the moment generated by the forces is zero. This line or point will be referred to as the center of force COF. In FIG. 2B, the center of force COF is indicated for the situation that all main coil block units are able to generate the same maximum force.

Preferably, the center of force fully coincides with the center of gravity of the second part including the parts supported by the second part as a mismatch between center of force and center of gravity will require a higher maximum force at least for one of the coil block units to achieve the same level of performance and will require compensation for the created moment. However, due to practical reasons, the center of force normally only coincides (approximately) in the first and second direction with the center of gravity and not in the third direction as aligning the coil block units with the center of gravity in the third direction would require a relatively large distance between the magnetic field generating first part and the current conductors of the second part which is undesired from a performance point of view.

Due to e.g. design modifications, the center of gravity may be shifted when comparing different stage systems. To comply with the desired requirement that the center of force at least partially coincides with the center of gravity, a design modification changing the center of gravity also requires a change of the displacement system. Current displacement systems can change their center of force, but at the cost of dramatic changes in design, space, etc. as will be explained with reference to FIG. 2B.

FIG. 2B discloses a conventional second part of a displacement device including four coil block units, two of the first kind and two of the second kind, the coil block units being arranged in a diagonal configuration, i.e. symmetrically arranged around one point. Assuming the coil block units are able to generate the same amount of force, the center of force is located at this symmetry point. When the center of gravity does not coincide with the center of force, the center of force is preferably shifted towards the center of gravity. However, shifting of the center of force requires undesired changes. For instance, shifting all coil block units will not only shift the center of gravity as well, but it also requires a design modification of the coil block unit carrying frame to which the coil block units are mounted. Shifting only a few coil block units will result in a change in size and again a modification of the coil block unit carrying frame.

Another possibility would be to modify the maximum generable force of a coil block unit, but this would require a change of the coil block unit itself, e.g. in terms of size and/or cooling which is also undesirable.

In prior art displacement devices, the magnetic fields generated by the magnets on the first part and the coil block units on the second part may have a significant influence (referred to as crosstalk) on additional positioning devices arranged nearby, e.g. a positioning device provided between the second part and a third part to position the third part relative to the second part. The crosstalk may manifest itself as disturbance forces for the additional positioning devices which are thus more difficult to control and may lead to inaccurate positioning of other components such as the third part.

SUMMARY

It is desirable to provide an improved displacement device, preferably a displacement device having a coil block unit configuration that can adapt its center of force without requiring a different amount of space or different types of coil block units.

It is further desirable to provide an improved displacement device in which the crosstalk of the magnets on the first part and/or the coil block units on the second part to other positioning devices are reduced.

According to an aspect of the invention, there is provided a displacement device comprising: a first part and a second part, wherein the second part is displaceable relative to the first part in a first direction, a second direction substantially perpendicular to the first direction, and a third direction perpendicular to both the first and second direction, the first part comprising a carrier that extends substantially parallel to the first and second direction and on which a system of magnets is arranged in accordance with a pattern, wherein the system of magnets includes first magnets having a magnetization direction substantially perpendicular to the carrier and directed towards the second part and second magnets having a magnetization direction substantially perpendicular to the carrier and directed away from the second part, the first and second magnets being arranged in accordance with a pattern of rows and columns substantially perpendicular thereto and enclosing an angle of approximately 45° with one of the first or second direction, such that the first magnets and the second magnets are arranged in each row and in each column alternately, wherein the second part includes an electric coil system having a set of coil block units, each coil block unit having current conductors that are arranged in a magnetic field of the system of magnets and are, in use, fed by a multi-phase system, wherein the set of coil block units comprises at least three first coil block units having current conductors oriented substantially parallel to the second direction; at least two second coil block units having current conductors oriented substantially parallel to the first direction, and wherein the displacement device comprises a controller configured to control the position of the second part relative to the first part by driving the coil block units with the multi-phase system, wherein when the second part mainly moves in the second direction the controller is configured to levitate the second part from the first part in the third direction by using first coil block units only.

According to another aspect of the invention, there is provided a displacement device with a first part and a second part which are displaceable relative to one another in a first direction and a second direction perpendicular to the first direction, the first part including a carrier which extends substantially parallel to the first and second direction and on which a system of magnets is fastened in accordance with a pattern whereby magnets of a first kind with a magnetization direction perpendicular to the carrier and directed towards the second part and magnets of a second kind with a magnetization direction perpendicular to the carrier and directed away from the second part are arranged in accordance with a pattern of rows and columns perpendicular thereto and enclosing an angle of approximately 45° with one of the first or second direction, such that the magnets of the first kind and the magnets of the second kind are arranged in each row and in each column alternately, the second part being provided with an electric coil system having a set of coil block units, each coil block unit having current conductors which are situated in a magnetic field of the system of magnets and are being fed by a multi-phase system, wherein the set of coil block units includes:

- at least one main coil block unit of a first kind having current conductors oriented parallel to the second direction,
- at least one main coil block unit of a second kind having current conductors oriented parallel to the first direction,
- wherein the main coil block units define a minimal first range in the first direction in which the main coil block units are located, and wherein the main coil block units further define a minimal second range in the second direction in which the main coil block units are located, the set of coil block units further including at least one secondary coil block unit of a first kind having current conductors oriented parallel to the second direction, wherein the at least one secondary coil block unit is located inside the second range and outside the first range, the second range being large enough so that the at least one secondary coil block unit can be placed in the second range at multiple distinct positions seen in the second direction to position a center of force determined by all coil block units in the second direction.

According to another aspect of the invention, there is provided a displacement device comprising: a first part and a second part that are displaceable relative to each other in six degrees of freedom, the first part comprising a carrier that defines a plane on which magnets are arranged to form a magnetic field, wherein the second part includes a primary coil system arranged to cooperate with the magnetic field to displace the second part in six degrees of freedom relative to the first part, wherein the second part further includes a secondary coil system arranged to cooperate with the magnetic field to provide a driving force between the first part and the second part in at least one degree of freedom, such that the center of force provided by all coil systems, in use, is located substantially at the center of gravity seen in a first and second direction that are orthogonal with respect to each other and substantially parallel to the plane defined by the carrier.

According to an aspect of the invention, there is provided in combination a stage system and a reference structure, e.g. a frame, for a lithographic apparatus, wherein a displacement device according to the first, second or third aspect of the invention is provided between the stage system and the reference structure such that the stage system is displaceable relative to the reference structure, and wherein the first part of the displacement device is provided on the reference structure and the second part of the displacement device is provided on the stage system.

According to another aspect of the invention, there is provided a lithographic apparatus comprising a combination of a stage system and a reference structure according to the invention.

According to a further aspect of the invention, there is provided a method for positioning a second part of a displacement device according to a first, second or third aspect of the invention, wherein the second part is levitated in a third direction substantially perpendicular to the first and second direction using coil block units of the same kind only.

According to another embodiment of the invention, there is provided a lithographic apparatus including a stage system which is moveable relative to a frame by a displacement device, the displacement device having a first part arranged on the frame and a second part arranged on the stage system, the first part and second part being displaceable relative to one another in a first direction and a second direction perpendicular to the first direction, the first part including a carrier which extends substantially parallel to the first and second direction and on which a system of magnets is fastened in accordance with a pattern whereby magnets of a first kind with a magnetization direction perpendicular to the carrier and directed towards the second part and magnets of a second kind with a magnetization direction perpendicular to the carrier and directed away from the second part are arranged in accordance with a pattern of rows and columns perpendicular thereto and enclosing an angle of approximately 45° with one of the first or second direction, such that the magnets of the first kind and the magnets of the second kind are arranged in each row and in each column alternately, the second part being provided with an electric coil system having a set of coil block units, each coil block unit having current conductors which are situated in a magnetic field of the system of magnets and are being fed by a multi-phase system, wherein the set of coil block units includes:
at least one main coil block unit of a first kind having current conductors oriented parallel to the second direction,
at least one main coil block unit of a second kind having current conductors oriented parallel to the first direction,
wherein the main coil block units define a minimal first range in the first direction in which the main coil block units are located, and wherein the main coil block units further define a minimal second range in the second direction in which the main coil block units are located, the set of coil block units further including at least one secondary coil block unit of a first kind having current conductors oriented parallel to the second direction, wherein the at least one secondary coil block unit is located inside the second range and outside the first range, the second range being large enough so that the at least one secondary coil block unit can be placed in the second range at multiple distinct positions seen in the second direction to position a center of force determined by all coil block units in the second direction.

According to yet another aspect of the invention, there is provided a method for positioning a stage system of a lithographic apparatus, the lithographic apparatus including a stage system which is moveable relative to a frame by a displacement device according to the first, second or third aspect of the invention, wherein the second part is levitated in a third direction perpendicular to the first and second direction using coil block units of the same kind.

According to another aspect of the invention, there is provided a lithographic apparatus comprising a displacement device including: a first part and a second part that are displaceable relative to each other in six degrees of freedom, the first part comprising a carrier that defines a plane on which magnets are arranged to form a magnetic field, wherein the second part includes a primary coil system arranged to cooperate with the magnetic field to displace the second part in six degrees of freedom relative to the first part, wherein the second part further includes a secondary coil system arranged to cooperate with the magnetic field to provide a driving force between the first part and the second part in at least one degree of freedom, such that the center of force provided by all coil systems, in use, is located substantially at the center of gravity seen in a first and second direction that are orthogonal with respect to each other and substantially parallel to the plane defined by the carrier.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
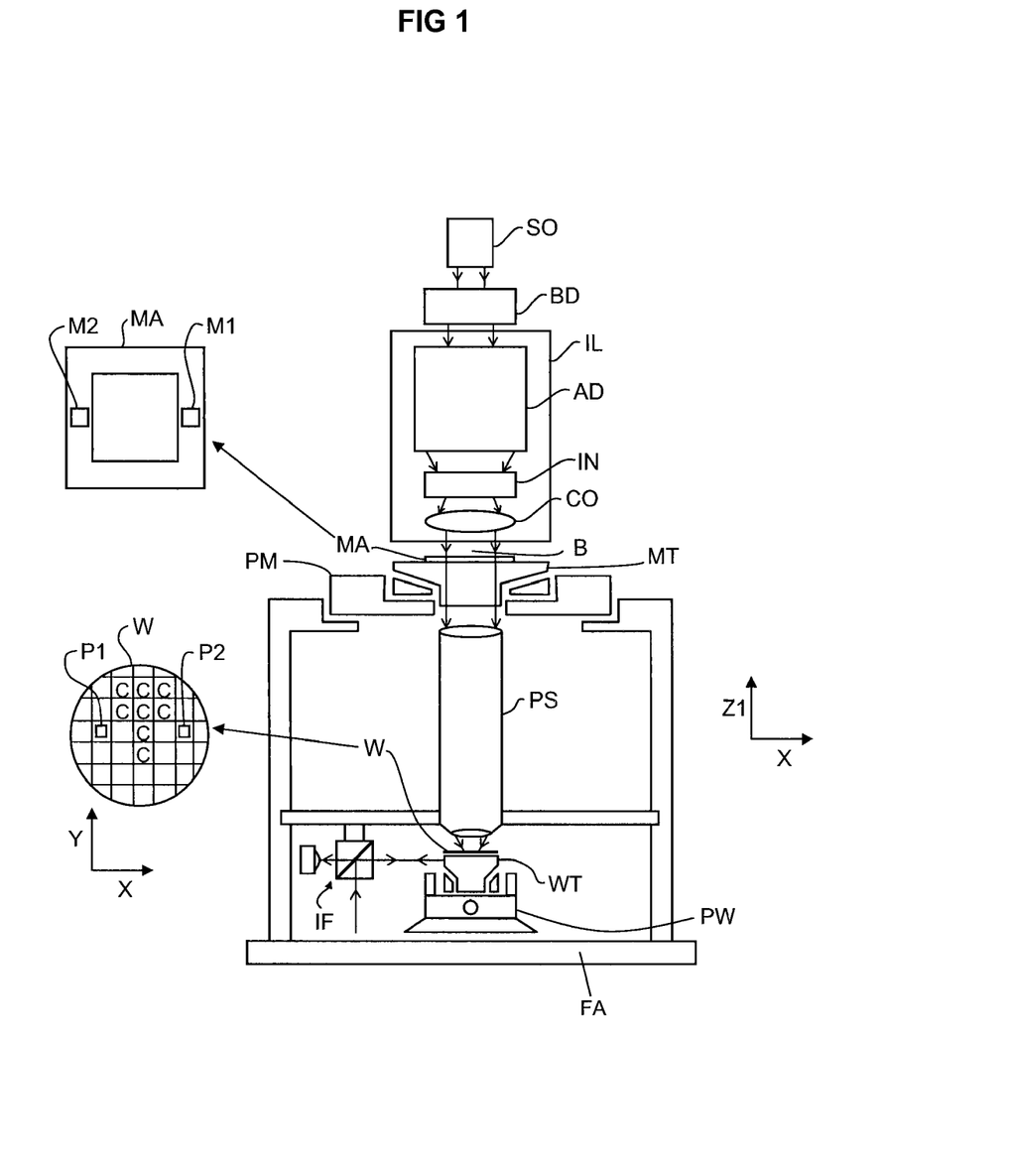
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small minors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM.

Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.
2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In this embodiment, the second positioning device PW, alternatively referred to as stage system, includes a displacement device as long-stroke module configured to provide a coarse positioning of the substrate table WT relative to a frame FA. The displacement device includes a first part arranged on the frame FA and a second part arranged on the second positioning device PW, such that the first and second part are displaceable relative to one another in a first direction X and a second direction Y perpendicular to the first direction X.

A portion of the first part FP is shown in FIG. 2A. The first part FP includes a carrier CA which extends substantially parallel to the first direction X and the second direction Y. The first and second direction X,Y are normally substantially perpendicular to the patterned radiation beam, so that in that case a third direction Z1 (see FIG. 1) substantially perpendicular to the first and second direction X,Y is parallel to the patterned radiation beam.

On the carrier CA a system of magnets is mounted in accordance with a pattern whereby magnets of a first kind N with a magnetization direction substantially perpendicular to the carrier CA (i.e. in the third direction (Z1)) and directed towards the second part and magnets of a second kind Z with a magnetization direction substantially perpendicular to the carrier CA (i.e. in the third direction (Z1)) and directed away from the second part are arranged in accordance with a pattern of rows and columns substantially perpendicular thereto and enclosing an angle of approximately 45 degrees with one of the first or second direction X,Y, such that the magnets of the first kind N and the magnets of the second kind Z are arranged in each row and in each column alternately. The angle of 45 degrees is shown in FIG. 2A relative to the first direction X. Magnets of the first kind and magnets of the second kind may alternatively be referred to as first magnets and second magnets respectively.

The magnetic pole pitch MP is defined by the distance between center points of two mutually adjoining magnets of different kinds (N and Z) in the first or second direction, i.e. the distance between mutually adjoining diagonal lines on which center points of magnets of the same kind are situated.

The system of magnets may further include magnets of a third kind with a magnetization direction substantially parallel to a plane defined by the first and second direction and directed towards the magnet of the first kind, the magnets of the third kind being present between each magnet of the first kind and of the second kind, i.e. in a so-called Hallbach configuration.

The second part SP arranged on the second positioning device PW includes an electric coil system having a set of coil block units. FIG. 2B, which shows a prior art electric coil system, will first be used to indicate the different components and the references used therefore in the subsequent figures.

FIG. 2B depicts an electric coil system having a set of coil block units which includes four coil block units CB. Each coil block unit has current conductors CC. The reference CC is only indicated for the top left coil block unit CB for simplicity reasons. The current conductors CC are schematically shown as single windings, however, in practice, multiple windings and different configurations may be used. The current conductors CC are situated in a magnetic field of the system of magnets as shown in FIG. 2A and are being fed by a multi-phase system. Although the presence of three current conductors CC per coil block unit CB as shown in FIG. 2B suggests the use of a three-phase system, alternative configurations such as a four-phase system or any other kind of multi-phase system are also envisaged.

In the embodiment of FIG. 2B, all four coil block units are similar of design and differ only in orientation and position. Two of the coil block units have current conductors mainly oriented parallel to the second direction Y (see the top left and bottom right coil block unit) so that these coil block units are capable of generating forces in the first direction X. These coil block units are alternatively referred to as coil block units of the first kind, first coil block units or X forcers.

The other two coil block units have current conductors oriented mainly parallel to the first direction X (see top right and bottom left coil block unit) so that these coil block units are capable of generating forces in the second direction Y. These coil block units are alternatively referred to as coil block units of the second kind, second coil block unit or Y forcers.

The array of four coil block units of FIG. 2B define a minimal first range FR in the first direction X and a minimal second range SR in the second direction Y in which the coil block units are located. The boundaries of the respective first and second range FR, SR are indicated by dashed lines. The coil block units CB are thus located in the region where the first range FR and the second range SR overlap.

All coil block units of this prior art embodiment are capable of generating the same maximum force. When both the X forcers and the Y forcers produce the same maximum force in respectively the first and second direction, the moment applied to the second part by the forces is zero with respect to a center of force COF. Due to the symmetrical configuration, the center of force COF is located in the middle of the four coil block units. Adapting the center of force may require shifting one or more of the coil block units in the first or second direction or changing the coil block units themselves. However, in case of shifting one or more coil block units, the coil block units will be positioned outside the first and/or second range and the effect is dependent on the initial mismatch between center of force and center of gravity. This results in an undesired situation.

Figure 3:
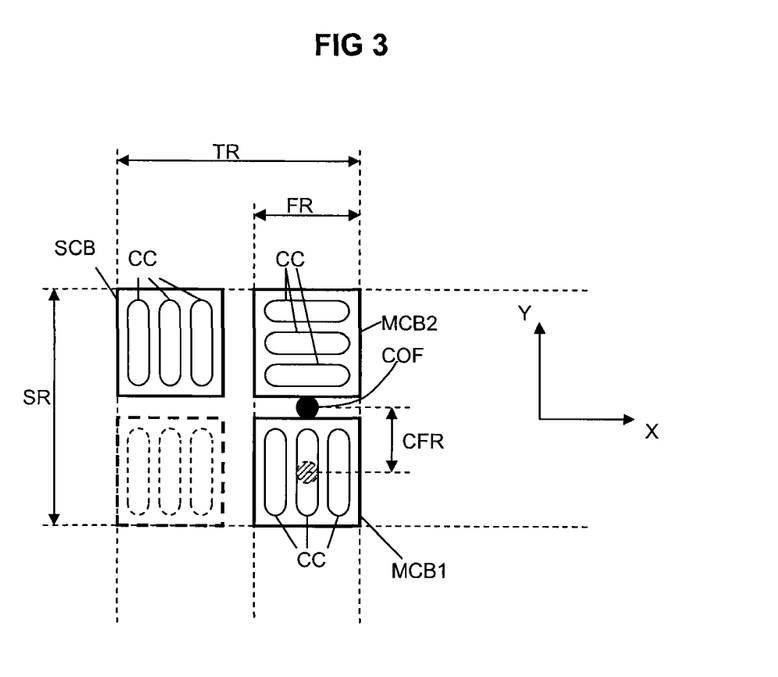
FIG. 3 depicts schematically a second part of a displacement device according to another embodiment of the invention.

FIG. 3 depicts a second part with an electric coil system that could be applied in the displacement device of FIG. 1. The electric coil system can be divided into a primary coil system and a secondary coil system. The set of coil block units of the primary coil system includes a main coil block unit of the first kind MCB1, i.e. a first main coil block unit, having current conductors CC oriented substantially parallel to the second direction Y, and a main coil block unit of the second kind MCB2, i.e. a second main coil block unit, having current conductors CC oriented substantially parallel to the first direction X. The first and second main coil block units are substantially fixed to the second part, i.e. the positioning range is limited with respect to a secondary coil block unit which will be explained below.

The first and second main coil block units define a minimal first range FR in the first direction X and a minimal second range SR in the second direction Y in which the main coil block units are located. The boundaries of the first and second range are indicated by corresponding dashed lines.

The secondary coil system includes a secondary coil block unit SCB of a first kind, i.e. a first coil block unit, having current conductors oriented substantially parallel to the second direction Y, wherein the secondary coil block unit is located inside the second range SR and outside the first range FR. The secondary and main coil block units define a minimal third range TR in the first direction X such that the secondary and main coil block units are located in the third and second range.

The second range SR is large enough to allow the secondary coil block unit to be placed at different positions seen in the second direction. In FIG. 3, the secondary coil block unit is shown at the top of the second range, but also at the bottom as ghost image to show the most extreme positions in the second direction.

Positioning the secondary coil block unit will set a position of a center of force COF determined by all coil block units in the second direction. This is shown in FIG. 3 by reference numeral COF indicating the position of the center of force when the secondary coil block unit is at the top of the second range. As a ghost image, the position of the center of force is indicated when the secondary coil block unit is at the bottom of the second range, so that a center of force range CFR can be defined in which the center of force can be positioned by appropriately positioning the secondary coil block unit. The secondary coil system is arranged to cooperate with the magnetic fields generated by the permanent magnets on the carrier to provide a driving force in at least one degree of freedom (here, the first direction X), such that the center of force provided by all coil systems, in use, is located substantially at the center of gravity seen in at least one direction substantially parallel to the plane defined by the carrier, preferably in two directions, e.g. the first and second direction X,Y, that are orthogonal with respect to each other and substantially parallel to the plane defined by the carrier.

A benefit of the configuration of FIG. 3 is that positioning the secondary coil block unit as shown above will not result in a different third and second range, so that the center of force can be positioned according to the position of the center of gravity without having to adapt the amount of space required by the coil block units on the second part, thereby being able to more easily optimize the displacement device to the stage system.

Further, the coil block units may be attached to the second part using a coil block unit carrying frame. This frame can be adapted to allow mounting of the secondary coil block unit at distinct locations, e.g. by providing multiple mounting holes for discrete mounting positions, or by providing a mounting slot allowing to slide the secondary coil block unit, thereby allowing to mount the secondary coil block unit at any desired location inside the second range SR.

Additionally, and especially in case the coil block units are not driven to apply their maximum force, the center of force can be fine tuned to the center of gravity by so-called gain balancing in which the individual currents through the different coil block units are adapted. This can be applied to all directions, e.g. one coil block unit could apply a high force in the first direction and a small force in the third direction, while another coil block unit of the same kind could do the opposite.

Figure 4:
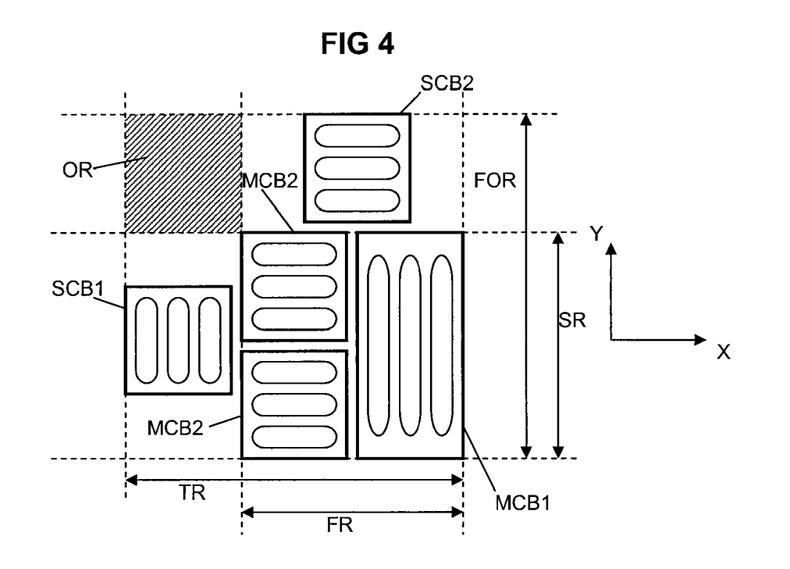
FIG. 4 depicts schematically a second part of a displacement device according to yet another embodiment of the invention.

FIG. 4 depicts an alternative embodiment of the second part of a displacement device suitable to be used in the stage system of FIG. 1. Shown is a set of coil block units, associated with a primary coil system, with one main coil block unit of the first kind MCB1, and two main coil block units of the second kind MCB2, together defining a first and second range FR, SR in which the main coil block units are located. The main coil block unit of the first kind MCB1 is in this embodiment configured to generate a larger maximum force than the maximum force that can be generated by the main coil block units of the second kind MCB2, e.g. twice as large.

The set of coil block units includes a secondary coil system with a secondary coil block unit of the first kind SCB1 having current conductors oriented substantially parallel to the second direction, wherein the secondary coil block unit SCB1 is located inside the second range and outside the first range. The second range SR is large enough to allow adjustment of the position of the center of force in the second direction by appropriately positioning the secondary coil block unit of the first kind SCB1.

The set of coil block units, i.e. the secondary coil system, also includes a secondary coil block unit of the second kind SCB2 having current conductors oriented substantially parallel to the first direction, wherein the secondary coil block unit SCB2 is located inside the first range and outside the second range. The first range FR is large enough to allow adjustment of the position of the center of force in the first direction by appropriately positioning the secondary coil block unit of the second kind SCB2.

The set of coil block units define a minimal third range TR and a minimal fourth range FOR in which the main and secondary coil block units are located. A benefit of this configuration is that both the secondary coil block units are able to be positioned at distinct positions to set the position of the center of force without having to alter the third and fourth range, so that the amount of space occupied by the coil block units remains constant. A further benefit is that the position of the center of force can be set in both the first and second direction.

One of the secondary coil block units is also able to be positioned in an overlapping range OR in case such adaptation is required, thereby still being located within the third and fourth range. However, as only one secondary coil block unit can be located in this overlapping range, the possible adaptations of the center of force in this area are limited.

The embodiment of FIG. 4 thus depicts a second part of a displacement device according to the second aspect of the invention.

Figure 5:
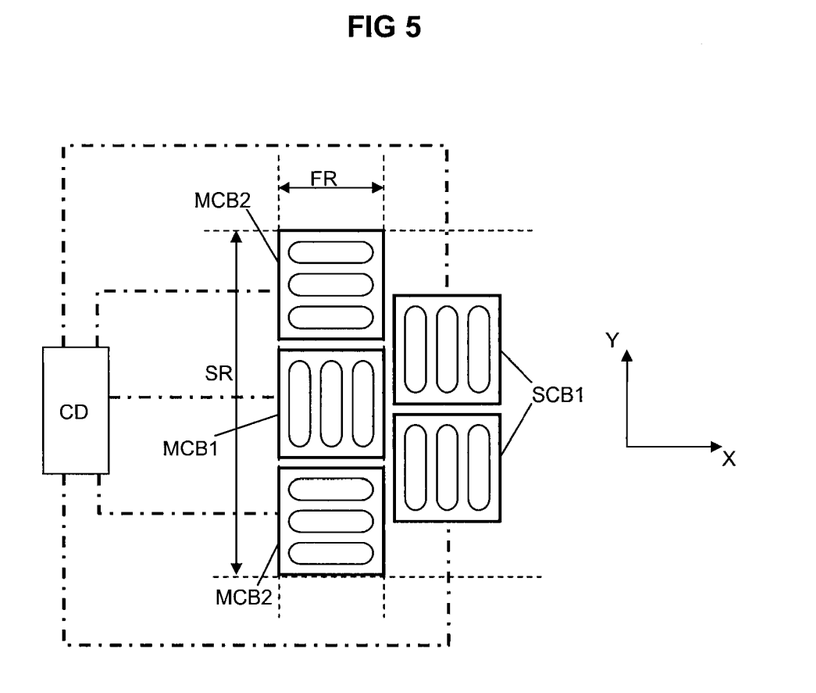
FIG. 5 depicts schematically a second part of a displacement device according to a further embodiment of the invention.

FIG. 5 depicts yet another embodiment of a set of coil block units arranged on the second part that could be used in the displacement device or stage system of FIG. 1. Shown are one main coil block unit of the first kind MCB1, and two main coil block units of the second kind MCB2 defining a first range FR and a second range SR. In the second range, but outside the first range are located two secondary coil block units SCB1 of the first kind. The second range is large enough to allow both the secondary coil block units to be positioned at distinct locations seen in the second direction, so that the center of force can be set in the second direction. This configuration clearly shows that the secondary coil block units are not limited to one.

The embodiment of FIG. 5 thus depicts a second part of a displacement device according to the second aspect of the invention. However, the embodiment of FIG. 5 also depicts a second part of a displacement device according to the first aspect of the invention.

The second part namely includes three first coil block units MCB1, SCB1 having current conductors oriented substantially parallel to the second direction Y, and two second coil block units MCB2 having current conductors oriented substantially parallel to the first direction X.

The displacement device further includes a control device or controller CD configured to control the position of the second part relative to the first part by driving the coil block units with a multi-phase system, here integrated into the control device CD. The driving capabilities of the control device are indicated schematically by dashed lines between the control device CD and the coil block units. The control unit CD is further configured to, when the second part is mainly moving in the second direction, levitate the second part from the first part in the third direction Z1 by using first coil block units MCB1, SCB1 only. As a result, no or less commutation will take place with respect to the first coil block units, so that the influence on other positioning device nearby will be constant or at most have a low-frequency behavior which is much easier to compensate. Further, commutation will take place with respect to the second coil block units, but as these coil block units are not used to levitate the second part, the currents there are much smaller, and thus the influence is significantly reduced, especially when moving with constant speed as this requires minimal driving forces and thus minimal driving current.

Figure 6:
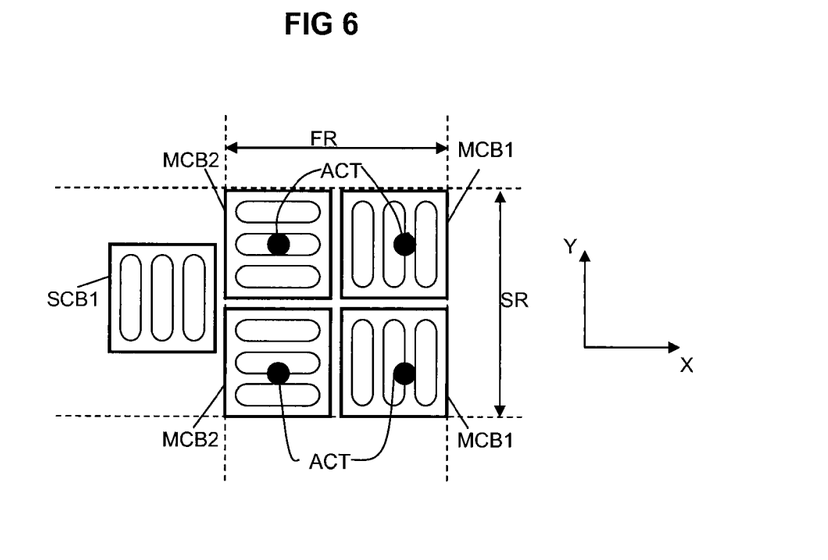
FIG. 6 depicts schematically a second part of a displacement device according to another embodiment of the invention.

FIG. 6 depicts yet another embodiment of a set of coil block units arranged on the second part. Shown are two main coil block units of the first kind MCB1 and two main coil block units of the second kind MCB2 defining a first range FR and a second range SR. In the second range, but outside the first range is located a secondary coil block unit of the first kind SCB1 which can be placed at distinct locations in the second range to set the position of the center of force in the second direction. In an embodiment, the main coil block units of the second kind are positioned at the position of the center of gravity of the second part seen in the first direction. In fact, the embodiment of FIG. 6 is similar to the embodiment of FIG. 3, but the primary coil system of FIG. 6 comprises more main coil block units allowing to control the position of the second part relative to the first part in more degrees of freedom.

Figure 7:
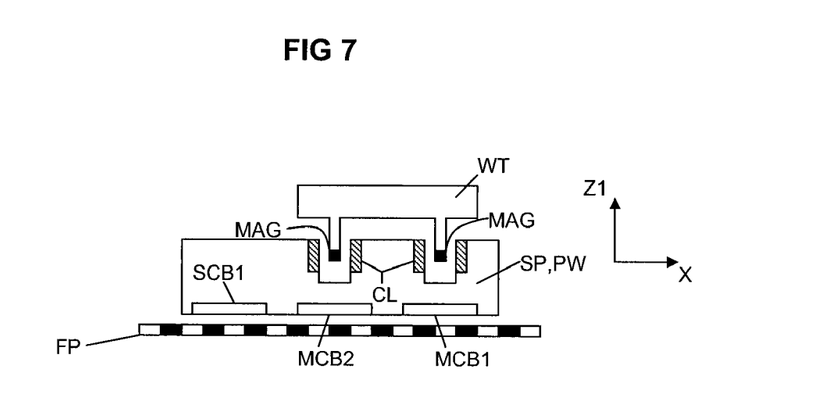
FIG. 7 depicts schematically a side view of a stage system already partially shown in FIG. 6.

FIG. 7 depicts schematically a stage system already partially shown in FIG. 6 in side view. FIG. 7 more clearly shows a first part FP with a system of magnets similar to FIG. 2A and the second part SP which is alternatively referred to as positioning device PW (see FIG. 1). A displacement device is thus provided as a long-stroke module to provide coarse positioning between the second part SP and a frame which includes the first part. A short-stroke module, i.e. a positioning device, configured to provide fine positioning is provided between the second part and a substrate table WT, i.e. a third part. In FIG. 7, only actuators ACT are shown which levitate the substrate table in a third direction Z1 substantially perpendicular to the first and second direction. The short-stroke module preferably also includes actuators to apply forces in the first and second direction (X,Y) to allow full six degrees of freedom positioning.

Each actuator ACT includes a coil CL arranged on the second part SP, wherein the coil CL cooperates with at least one magnet MAG arranged on the substrate table WT. In total four actuators ACT are provided of which only two can be seen in FIG. 7.

The actuators ACT are provided above the coil block units. The projection of the actuators on the coil block units is shown in FIG. 6. Both the system of magnets on the first part FP and the coil block units on the second part SP generate magnetic fields which extend in all directions, including the third direction Z1. The actuators ACT are thus located in these magnetic fields. The magnetic fields influence the interaction between coil CL and magnet MAG and manifest itself as disturbance forces reducing the position accuracy of the actuators ACT and possibly deforming the substrate table WT. As the magnetic field strength of a magnetic field diminishes with increasing distance from a magnetic field generating component, the actuators ACT are influenced the most by magnetic field generating components nearby, so that in FIG. 7, the left actuator ACT is mostly influenced by the main coil block unit of the second kind MCB2 below the actuator and less by the other coil block units, and the right actuator ACT is mostly influenced by the main coil block unit of the first kind MCB1 below the actuator.

The shown configuration of coil block units in combination with the orientation of the actuators ACT of the short-stroke module poses some benefits over prior art configurations. First of all, the position of the center of force in the second direction Y can be set by the secondary coil block unit SCB1 without changing the amount of space required by the set of coil block units and also with minimal changing of the influence of the secondary coil block unit SCB1 to the actuators ACT, as no actuator ACT is positioned above the secondary coil block unit SCB1, as can be best seen in FIG. 7.

Another benefit may be that not all coil block units have to be used to levitate the second part, so that the coil block units which do not have to be used for levitation will draw less current, thereby minimizing the magnitude of the generated magnetic field and thus reduce the amount of influence. In an embodiment, levitation is provided using only main coil block units of the same kind, possibly including the secondary coil block unit which is preferably also of the same kind. Which main coil block units of the same kind are used for levitation may depend on the direction of travel. If chosen properly, frequency components in the influence due to commutation may also be reduced or eliminated, so that only a static influence is experienced which is easier to compensate from control point of view.

For instance, the main coil block units of the first kind MCB1 and the secondary coil block unit of the first kind SCB1 can be used to levitate the second part SP, and by controlling the individual levitation forces it is not only possible to control the position of the second part in the third direction Z1, but also to control the position of the second part about two rotation axis which are non-parallel to each other, but both parallel to a plane spanned/defined by the first and second direction. As the main coil block units of the second kind MCB2 do not have to be used for levitation, the currents through the corresponding current conductors are smaller and thus the influence on the actuators ACT above the respective coil block units is smaller.

Further, a movement of the second part SP in the second direction Y will result in minimal commutation of the current in the main and secondary coil block units of the first kind MCB1, SCB1, so that the influence of the main coil block units of the first kind MCB1 during movement of the second part SP in the second direction Y is more or less constant and has substantially no frequency content as a result of the movement. On the contrary, commutation will take place in the main coil block units of the second kind MCB2, but there the currents are substantially smaller due to the absence of the levitation forces, especially when moving at constant velocity which requires only small forces in the second direction to overcome friction and disturbances. This method of driving the coil block units is especially beneficial when the second direction is the scanning direction during exposure of the substrate as explained with reference to FIG. 1.

It is also possible to levitate the second part SP using the two main coil block units of the second kind MCB2 and the secondary coil block unit SCB1 and still be able control the position of the second part in the third direction and about two non-parallel rotation axes parallel to a plane defined by the first and second direction. As a result, the main coil block units of the first kind MCB1 do not have to be used for levitation, resulting in smaller currents and thus a smaller influence on the actuators above the respective coil block units MCB1. Further, moving in the first direction X, especially with constant velocity will result in more or less no commutation in the main coil block units of the second kind and the secondary coil block unit SCB1, so that the influence has substantially no frequency content and is constant which is easier to compensate from control point of view, and the currents in the main coil block units of the first kind are small due to the absence of levitation forces (and possibly even smaller due to the constant velocity), so that the influence of the main coil block units of the first kind is minimized.

With four actuators ACT, it is possible to control the position of the substrate table in the third direction as a 3DOF system by connecting two actuators in series, so that they act as one actuator. In an embodiment, actuators positioned above coil block units of the same kind, i.e. the first kind or the second kind, are connected to act as one actuator, as the influence of the coil block units on the actuators will then be substantially the same. However, in an embodiment, all four actuators may be controlled independently.

In an embodiment, the spacing between two actuators is 2 times n times the magnetic pitch MP of the system of magnets of the first part (see FIG. 2A), where n is a positive integer. In that case, the influence of the system of magnets on the two actuators is substantially the same.

An additional benefit of the configuration of FIGS. 6 and 7 may be that larger accelerations may be generated in the first direction than in the second direction, which may be required in case the second direction is the scanning direction as explained with reference to FIG. 1.

Another additional benefit of the configuration may be that remaining influences of the system of magnets and/or the coil block units result in disturbance forces that do not deform the substrate table WT, but only change the position and orientation of the substrate table, which are easier to measure and compensate by using appropriate control of the actuators ACT.

The performance of the displacement device may further be improved by positioning the mass centers of coil block units of the same kind viewed in a direction perpendicular to the current conductors according to the disclosure of US 2002/0000904, the content of which is incorporated by reference herewith.

The embodiment of FIGS. 6 and 7 thus depicts a stage system with a displacement device according to the first and second aspect of the invention. Between the second part SP and the third part WT, additional positioning devices may be provided to displace the third part relative to the second part in the first or second direction, wherein the distance between these actuators in respectively the first or second direction equals (n+0.5) times the smallest distance between magnets of the same kind, i.e. (n+0.5) times the magnetic pole pitch, where n is a positive integer.

The above described method of positioning the second part while levitating the second part only using coil block units of the same kind can be performed by a control device in a similar manner as described in relation to FIG. 5. For both embodiments and all related embodiments it is possible that the displacement device includes one or more sensors to measure the position of the second part relative to the first part, which may be done in a direct manner, i.e. a sensor provided between the second part and the first part, or in an indirect manner, i.e. using one or more sensors from which the position may not be directly derived, but which can be used to calculate or determine the relative position. The output of these sensor(s) can be used as input for the control device to close the feedback loop. However, in addition or alternatively, feed forward control can be used in which case no sensors are required.

Figure 8:
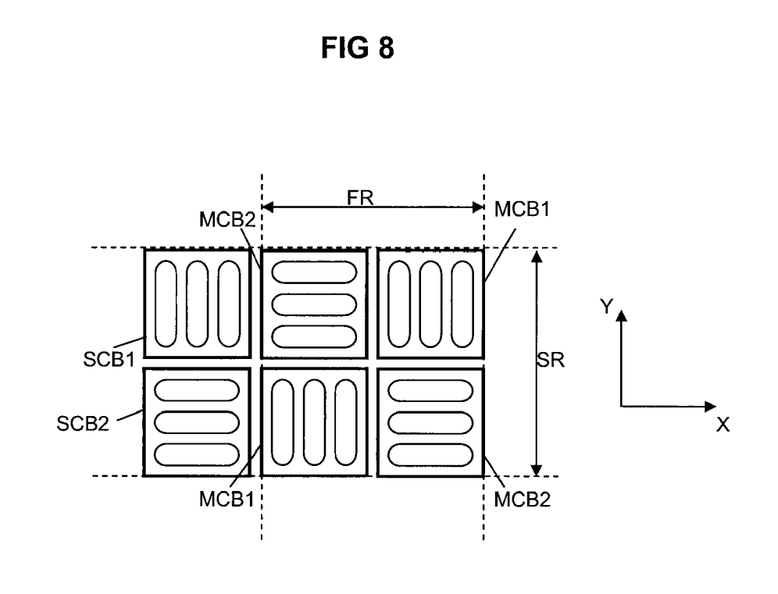
FIG. 8 depicts schematically a second part of a displacement device according to yet another embodiment of the invention.

FIG. 8 depicts a second part of a displacement device according to an embodiment of the invention. The second part is displaceable relative to a first part as described with reference to FIG. 1 in six degrees of freedom, i.e. three translations in orthogonal directions X, Y and Z1 and three rotations around said orthogonal directions. The first part comprises a carrier that defines a plane on which magnets are arranged to form a magnetic field, e.g. the carrier of FIG. 2A.

The second part includes a primary coil system arranged to cooperate with the magnetic field to displace the second part in six degrees of freedom relative to the first part. In this embodiment, the primary coil system comprises two first main coil block units MCB1 having current conductors oriented substantially parallel to the second direction Y and two second main coil block units MCB2 having current conductors oriented substantially parallel to the first direction X. The first and second main coil block units are arranged in a 2×2 array, wherein the first main coil block units MCB1 are positioned on the diagonal of the 2×2 array. The primary coil system defines a first range FR in the first direction X in which the first and second main coil block units are located and further defines a second range SR in the second direction in which the first and second main coil block units are located.

The second part further includes a secondary coil system arranged to cooperate with the magnetic filed that is generated by the magnets on the carrier to provide a driving force between the first part and the second part in at least one degree of freedom, such that the center of force provided by all coil systems, in use, is located substantially at the center of gravity of the second part in two directions that are orthogonal with respect to each other and parallel to the plane defined by the carrier, i.e. the first and second directions X,Y.

The secondary coil system therefore comprises a first secondary coil block unit SCB1 having current conductors oriented substantially parallel to the second direction Y, and a second secondary coil block unit SCB2 having current conductors oriented substantially parallel to the first direction X. The first and second secondary coil block unit are located outside the first range FR, but inside the second range SR.

Together, the first and second secondary coil block units and the first and second main coil block units are arranged in a 2×3 array. The benefit of the secondary coil system is that in both directions X Y, additional forces can be generated to set the center of force at the desired location without having to alter the position of the coil block units.

Further, as mentioned before, the positioning of the center of force can be determined by controlling the currents through the current conductors. This is beneficial when fine-tuning the center of force to a center of gravity.

In this embodiment, the first and second main coil block units and the first and second secondary coil block units are arranged such that the coil block units having current conductors oriented substantially parallel to the second direction and the coil block units having current conductors oriented substantially parallel to the first direction are arranged alternately in each row and column of the 2×3 array.

The embodiment of FIG. 8 thus depicts a second part of a displacement device according to the first and third aspects of the invention.

Although the displacement device has been shown to provide coarse positioning the substrate table only, it will be apparent to the person skilled in the art, that the displacement device according to the invention may be applied for the reticle stage system as well, and may be also be applied for other systems, e.g. for fine positioning the substrate table or reticle. Further, features of different embodiments or aspects may be combined where appropriate as is already illustrated with respect to the Figures in which an embodiment may comply with more than one aspect of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topogaphy of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A displacement device comprising:
a first part and a second part, wherein the second part is displaceable relative to the first part in a first direction, a second direction substantially perpendicular to the first direction, and a third direction substantially perpendicular to both the first and second direction, the first part comprising a carrier that extends substantially parallel to the first and second direction and on which a system of magnets is arranged in accordance with a pattern, wherein the system of magnets includes first magnets having a magnetization direction substantially perpendicular to the carrier and directed towards the second part and second magnets having a magnetization direction substantially perpendicular to the carrier and directed away from the second part, the first and second magnets being arranged in accordance with a pattern of rows and columns substantially perpendicular thereto and enclosing an angle of approximately 45° with one of the first or second direction, such that the first magnets and the second magnets are arranged in each row and in each column alternately,
wherein the second part includes an electric coil system having a set of coil block units, each coil block unit having current conductors that are arranged in a magnetic field of the system of magnets and are, in use, fed by a multi-phase system, wherein the set of coil block units comprises
at least three first coil block units having current conductors oriented substantially parallel to the second direction, the at least three first coil block units spaced apart from each other along the first direction or the second direction or both the first and the second direction;
at least two second coil block units having current conductors oriented substantially parallel to the first direction,
and wherein the displacement device comprises a controller configured to control the position of the second part relative to the first part by driving the coil block units with the multi-phase system, wherein when the second part mainly moves in the second direction the controller is configured to levitate the second part from the first part in the third direction by using first coil block units only.

2. The displacement device of claim 1, wherein two first coil block units and two second coil block units are arranged to allow 6 degrees of freedom control of the second part relative to the first part via the controller, and wherein the remaining first and second coil block units are arranged to set a center of force determined by all first and second coil block units at a desired location.

3. In combination a stage system and a reference structure for a lithographic apparatus, wherein a displacement device according to claim 1 is provided between the stage system and the reference structure such that the stage system is displaceable relative to the reference structure, and wherein the first part of the displacement device is provided on the reference structure and the second part of the displacement device is provided on the stage system.

4. The combination of claim 3, wherein the reference structure is a frame of the lithographic apparatus.

5. The combination of claim 3, wherein the stage system comprises a third part that is displaceable relative to the second part by a positioning device that is arranged between the second part and the third part, wherein the positioning device includes actuators to levitate the third part from the second part in the third direction, and wherein the distance between said actuators in both the first and second direction equals n times the smallest distance between magnets of the same kind, where n is a positive integer.

6. The combination of claim 3, wherein the stage system comprises a third part that is displaceable relative to the second part by a positioning device that is arranged between the second part and the third part, wherein the positioning device includes actuators to displace the third part in the first or second direction relative to the second part, and wherein the distance between said actuators in respectively the first or second direction equals (n+0.5) times the smallest distance between magnets of the same kind, where n is a positive integer.

7. The combination of claim 3, wherein the stage system comprises a third part that is displaceable relative to the second part by a positioning device that is arranged between the second part and the third part, wherein the positioning device includes actuators to levitate the third part from the second part in the third direction, and wherein the distance between said actuators in both the first and second direction equals (n+0.5) times the smallest distance between magnets of the same kind, where n is a positive integer.

8. The combination of claim 3, wherein the stage system comprises a third part that is displaceable relative to the second part by a positioning device that is arranged between the second part and the third part, wherein the positioning device includes actuators to displace the third part in the first or second direction relative to the second part, and wherein the distance between said actuators in both the first and second direction equals n times the smallest distance between magnets of the same kind, where n is a positive integer.

9. A lithographic apparatus comprising the combination of claim 3.

10. The lithographic apparatus of claim 9, comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate,
wherein the stage system supports the substrate table.

11. The lithographic apparatus of claim 10, wherein the substrate table is a third part of the stage system.

12. A displacement device comprising:
a first part and a second part that are displaceable relative to each other in a first direction and a second direction substantially perpendicular to the first direction, the first part comprising a carrier that extends substantially parallel to the first and second direction and on which a system of magnets is arranged in accordance with a pattern, wherein the system of magnets includes first magnets having a magnetization direction substantially perpendicular to the carrier and directed towards the second part and second magnets having a magnetization direction substantially perpendicular to the carrier and directed away from the second part, the first and second magnets being arranged in accordance with a pattern of rows and columns substantially perpendicular thereto and enclosing an angle of approximately 45° with one of the first or second direction, such that the first magnets and the second magnets are arranged in each row and in each column alternately,
wherein the second part includes an electric coil system having a set of coil block units, each coil block unit having current conductors that are arranged in a magnetic field of the system of magnets and are; in use, fed by a multi-phase system,
wherein the set of coil block units comprises
a first main coil block unit having current conductors oriented substantially parallel to the second direction,
a second main coil block unit having current conductors oriented substantially parallel to the first direction,
wherein the first and second main coil block units define a minimal first range in the first direction in which the first and second main coil block units are located, and wherein the first and second main coil block units further define a minimal second range in the second direction in which the first and second main coil block units are located,
wherein the set of coil block units further comprises a first secondary coil block unit having current conductors oriented substantially parallel to the second direction, wherein the first secondary coil block unit is located inside the second range and outside the first range, the second range being large enough so that the first secondary coil block unit can be placed in the second range at multiple distinct positions seen in the second direction to position a center of force determined by all coil block units in the second direction.

13. The displacement device of claim 12, wherein the second main coil block units are located such that the position of the center of force in the first direction is substantially aligned with the position of the center of gravity in the first direction of the second part including parts supported by the second part.

14. In combination a stage system and a reference structure for a lithographic apparatus, wherein a displacement device according to claim 12 is provided between the stage system and the reference structure such that the stage system is displaceable relative to the reference structure, and wherein the first part of the displacement device is provided on the reference structure and the second part of the displacement device is provided on the stage system.

15. A displacement device comprising:
a first part and a second part that are displaceable relative to each other in six degrees of freedom, the first part comprising a carrier that defines a plane on which magnets are arranged to form a magnetic field,
wherein the second part includes a primary coil system arranged to cooperate with the magnetic field to displace the second part in six degrees of freedom relative to the first part,
wherein the second part further includes a secondary coil system arranged to cooperate with the magnetic field to provide a driving force between the first part and the second part in at least one degree of freedom, such that the center of force provided by all coil systems, in use, is located substantially at the center of gravity seen in a first and second direction that are orthogonal with respect to each other and substantially parallel to the plane defined by the carrier.

16. The displacement device of claim 15, wherein the primary coil system comprises
two first main coil block units having current conductors oriented substantially parallel to the second direction;
two second main coil block units having current conductors oriented substantially parallel to the first direction;
wherein the first and second main coil block units are arranged in a 2×2 array substantially parallel to the plane defined by the carrier, such that the first main coil block units are placed on a diagonal of the 2×2 array,
and wherein the secondary coil system comprises a first secondary coil block unit having current conductors oriented substantially parallel to the second direction, and a second secondary coil block unit having current conductors oriented substantially parallel to the first direction,
and wherein the first and second main coil block units and the first and second coil block units together form a 2×3 array.

17. The displacement device of claim 16, wherein the first and second main coil block units and the first and second secondary coil block units are arranged such that the coil block units having current conductors oriented substantially parallel to the second direction and the coil block units having current conductors oriented substantially parallel to the first direction are arranged alternately in each row and column of the 2×3 array.

18. In combination a stage system and a reference structure for a lithographic apparatus, wherein a displacement device according to claim 15 is provided between the stage system and the reference structure such that the stage system is displaceable relative to the reference structure, and wherein the first part of the displacement device is provided on the reference structure and the second part of the displacement device is provided on the stage system.

19. A method for positioning a second part of a displacement device, the displacement device comprising
a first part and a second part, wherein the second part is displaceable relative to the first part in a first direction, a second direction substantially perpendicular to the first direction, and a third direction substantially perpendicular to both the first and second direction, the first part comprising a carrier that extends substantially parallel to the first and second direction and on which a system of magnets is arranged in accordance with a pattern, wherein the system of magnets includes first magnets having a magnetization direction substantially perpendicular to the carrier and directed towards the second part and second magnets having a magnetization direction substantially perpendicular to the carrier and directed away from the second part, the first and second magnets being arranged in accordance with a pattern of rows and columns substantially perpendicular thereto and enclosing an angle of approximately 45° with one of the first or second direction, such that the first magnets and the second magnets are arranged in each row and in each column alternately,
wherein the second part includes an electric coil system having a set of coil block units, each coil block unit having current conductors that are arranged in a magnetic field of the system of magnets and are, in use, fed by a multi-phase system,
wherein the set of coil block units comprises
at least three first coil block units having current conductors oriented substantially parallel to the second direction, the at least three first coil block units spaced apart from each other along the first direction or the second direction or both the first and the second direction;
at least two second coil block units having current conductors oriented substantially parallel to the first direction,
and wherein the displacement device comprises a controller configured to control the position of the second part relative to the first part by driving the coil block units with the multi-phase system, wherein when the second part mainly moves in the second direction the controller is configured to levitate the second part from the first part in the third direction by using first coil block units only,
the method comprising: levitating the second part in a third direction substantially perpendicular to the first and second direction using coil block units of the same type only.

20. The method of claim 19, wherein during movement of the stage system in the second direction, the second part is levitated by first coil block units.

* * * * *